(12) United States Patent
Wang et al.

(10) Patent No.: US 6,221,791 B1
(45) Date of Patent: Apr. 24, 2001

(54) APPARATUS AND METHOD FOR OXIDIZING SILICON SUBSTRATES

(75) Inventors: Chien-Jiun Wang, Yung-Ho; Ching-Yu Huang, Yi-Lan; Yu-Sen Chu, Kuo-Hsiung; Kuo-Hung Liao, Hsinchu, all of (TW)

(73) Assignee: Taiwan Semiconductor Manufacturing Company, LTD, Hsin Chu (TW)

( * ) Notice: Subject to any disclaimer, the term of this patent is extended or adjusted under 35 U.S.C. 154(b) by 0 days.

(21) Appl. No.: 09/324,131

(22) Filed: Jun. 2, 1999

(51) Int. Cl.$^7$ .................................................. C23C 16/00
(52) U.S. Cl. .................. 438/773; 118/715; 118/719; 427/255.27
(58) Field of Search .................. 438/773; 118/715, 118/719; 427/255.27

(56) References Cited
U.S. PATENT DOCUMENTS 5,234,501 * 8/1993 Nakao .................................. 118/719

* cited by examiner

Primary Examiner—Richard Bueker
(74) Attorney, Agent, or Firm—Tung & Associates

(57) ABSTRACT

An apparatus and a method for oxidizing silicon substrates by either a wet oxidation or a dry oxidation process in the same oxidation chamber are provided. In the apparatus, an additional conduit is provided for evacuating any residual water vapor trapped in a conduit section between an external torch and the oxidation chamber such that residual water vapor does not flow into the oxidation chamber and cause problems for a dry oxidation process subsequently conducted. The present invention novel apparatus therefore allows thin silicon oxide films such as those used in gate oxides to be formed with high quality in the same oxidation chamber. The present invention novel apparatus further allows high quality tri-layered silicon oxide films to be formed in a dry-wet-dry oxidation process for achieving satisfactory deposition rates and high quality oxide films on the substrate. The present invention novel apparatus and method further allows the same oxidation chamber to be used in a dry oxidation process immediately following a wet oxidation process.

20 Claims, 1 Drawing Sheet

APPARATUS AND METHOD FOR OXIDIZING SILICON SUBSTRATES

FIELD OF THE INVENTION

The present invention generally relates to an apparatus and a method for oxidizing silicon substrates and more particularly, relates to an apparatus for conducting either a wet oxidization or dry oxidization process on silicon substrates that is equipped with an exhaust conduit for purging a conduit connecting a torch to an oxidization chamber such that residual water vapor in the conduit can be evacuated allowing the chamber to be used in a dry oxidization process and a method for using such chamber.

BACKGROUND OF THE INVENTION

The formation of silicon oxide on a silicon substrate is a frequently conducted process in the fabrication of semiconductor devices. One of the methods for forming silicon oxide is thermal oxidization which is carried out by subjecting a silicon wafer to an oxidizing ambient at elevated temperatures. A common objective of an oxidizing system is to obtain a high quality silicon oxide film of uniform thickness while maintaining a low thermal budget (the product of temperature and time). Methods have been developed to increase the oxidation rate and to reduce the oxidation time and temperature. Two of such methods are the dry oxidation method and the wet oxidation method by using an external torch.

The substances used to grow thermal oxides on a silicon surface are dry oxygen and water vapor. In a dry oxygen reaction, silicon oxide is formed by $Si+O_2 \rightarrow SiO_2$, while for water vapor, the reaction is $Si+2H_2O \rightarrow SiO_2+2H_2$. In both cases, silicon is consumed and converted into silicon dioxide.

In a dry oxidation process, silicon dioxide layers can be formed in a temperature range of 400° C. ~1150° C. The process is typically performed in a resistance-heated furnace or in a rapid thermal processing chamber with heat provided by tungsten halogen lamps. In a typical dry oxidation process, a horizontal furnace tube may be used in which a batch of wafers is introduced into the furnace tube positioned in a slow moving wafer boat and then heated to an oxidation temperature in a ramp-up process. The wafers are held at the elevated temperature for a specific length of time and then brought back to a low temperature in a ramp-down process. In the dry oxidation process, oxygen mixed with an inert carrier gas such as nitrogen is passed over the wafers that are held at an elevated temperature.

A wet oxidation process can be performed by either bubbling oxygen through a high purity water bath maintained at between 85° C. and 95° C., or by a direct reaction of hydrogen with oxygen producing water vapor in a pyrogenic steam oxidation process.

The thermal budget required to grow a silicon oxide layer to a certain thickness is considerably smaller in a wet oxidation process than that in a dry oxidation process. The wet oxidation process for producing a silicon oxide film can therefore be carried out more efficiently and at a lower cost. However, because of a residual water content, silicon oxide films formed by the wet oxidation process exhibit a lower dielectric strength and has higher porosity to impurity penetration than silicon oxide films formed in a dry oxidation process. As a compromise, wet oxidation process is frequently used in conjunction with dry oxidation process such that a high quality oxide film can be grown with minimized oxidation time required. This is performed by beginning and ending an oxidation process in dry oxygen while using the wet oxidation process for the intermediate stage which reduces the thermal budget while increasing the overall oxide growth rate. By using this dry oxidation-wet oxidation-dry oxidation process sequence, high quality silicon oxide films can be grown on both sides of the oxide layer in order to provide properties of the three-layered film comparable to those of a single layer grown by a dry oxidation process alone.

Another benefit of the wet oxidation process is that the apparatus used for carrying out the wet oxidation may also be used to carry out a dry oxidation process. For instance, as shown in FIG. 1, a wet oxidation apparatus 10 consists of an oxidation chamber 12, an external torch 14, and a conduit 16 that connects the external torch 14 and the oxidation chamber 12 for providing fluid communication therein between. The wet oxidation apparatus 10 further includes conduit 20 for feeding an inert gas into conduit 16 for purging both the conduit 16 and the oxidation chamber 12, conduit 22 for flowing oxygen into the external torch 14 by a carrier inert gas, and conduit 24 for flowing hydrogen into the external torch 14 with an inert carrier gas. An exhaust conduit 28 takes away unused or excess water vapor in the oxidation chamber 12. The flow of gases in conduits 20, 22 and 24 is controlled by valves 30, 32 and 34, respectively.

In the wet oxidation apparatus 12, shown in FIG. 1, processing difficulties and problems frequently occur when the apparatus is used in carrying out a dry oxidation process. One of the major difficulties is residual water vapor found in the conduit 16 and in the torch 14. Residual water vapor or condensed water cumulates at the lower portion 36 of the conduit 16. The residual water vapor found in the conduit presents great difficulties in the thickness control of a thin gate oxide deposition process, causing particle issues and producing gate oxide films of low quality. Furthermore, the residual water vapor found in the conduit makes it difficult to carry out a dry oxidation process in the same oxidation chamber 12, since the residual water vapor frequently flows back into the chamber during a dry oxidation process.

It is therefore an object of the present invention to provide an apparatus for oxidizing silicon substrates that does not have the drawbacks or shortcomings of the conventional apparatus.

It is another object of the present invention to provide an apparatus for performing a wet oxidation process on silicon substrates that can also be advantageously used for a dry oxidation process.

It is a further object of the present invention to provide an apparatus for the wet oxidation of silicon substrates that does not have the residual water vapor problem after a wet oxidation process is conducted.

It is another further object of the present invention to provide an apparatus for the wet oxidation of silicon substrates that is equipped with an additional conduit for exhausting residual water vapor from a conduit connecting an external torch and an oxidation chamber.

It is still another object of the present invention to provide an apparatus for the wet oxidation of silicon substrates that does not have the residual water vapor problem in the conduit such that the apparatus can be subsequently used for a dry oxidation process.

It is yet another object of the present invention to provide a method for conducting a wet oxidation process on silicon substrates in an oxidation chamber and then immediately conducting a dry oxidation process in the same chamber without the residual water vapor problem.

It is still another further object of the present invention to provide a method for preventing vapor contamination in an oxidation chamber by providing the oxidation chamber with an additional conduit for exhausting any residual water vapor in a conduit that connects an external torch to the oxidation chamber.

It is yet another further object of the present invention to provide an apparatus for conducting a wet oxidation process on silicon substrates by providing an additional conduit for exhausting any residual water vapor left in the conduit or the chamber such that the apparatus can be immediately used for conducting a dry oxidation process.

SUMMARY OF THE INVENTION

In accordance with the present invention, an apparatus and a method for oxidizing silicon substrates are provided.

In a preferred embodiment, an apparatus for oxidizing silicon substrates is provided which includes an oxidation chamber for conducting an oxidation reaction of silicon substrates therein, a first conduit for feeding $H_2$ into an external torch, a second conduit for feeding $O_2$ into the external torch, a third conduit for feeding $H_2O$ vapor generated in the external torch into the oxidation chamber, the third conduit further includes a first valve mounted between the external torch and the oxidation chamber, a fourth conduit for feeding an inert gas into the third conduit at a location between the first valve and the oxidation chamber, the fourth conduit further includes a second valve, and a fifth conduit controlled by a third valve that has a first end in fluid communication with the third conduit upstream of the first valve and a second end in fluid communication with an exhaust from the oxidation chamber such that residual water vapor in the third conduit after a wet oxidation process is purged out.

In the apparatus for oxidizing silicon substrates, the apparatus may be adapted for conducting a wet oxidation process or for conducting a dry oxidation process, the first conduit and the second conduit each may include a valve and a mass flow controller. The fourth conduit may be adapted for feeding an inert gas into the oxidation chamber for annealing the silicon substrate.

In the apparatus for oxidizing silicon substrates, a section of the third conduit between the external torch and the first valve may contain residual water vapor after a wet oxidation process is conducted in the oxidation chamber. The apparatus may further include a sixth conduit in fluid communication with a cavity in the oxidation chamber for exhausting into a factory exhaust. The fourth conduit feeds $N_2$ gas into the oxidation chamber for annealing the silicon substrates. The fifth conduit may feed an inert gas from the fourth conduit for carrying residual water vapor in the third conduit into the exhaust The present invention is also directed to a method for preventing vapor contamination in an oxidation chamber which can be carried out by the steps of providing an oxidation chamber equipped with a torch, a first conduit providing fluid communication between the chamber and the torch controlled by a first valve situated in the first conduit, a second conduit for feeding an inert gas into the first conduit at a location between the first valve and the chamber, and a third conduit connected to the first conduit for exhausting residual water vapor in the first conduit into a factory exhaust pipe, flowing water vapor from the torch into the chamber through the first conduit for conducting a wet oxidation process in the chamber, closing the first valve, flowing an inert gas through the second conduit into the chamber for purging the chamber, and flowing an inert gas through the torch and the third conduit for purging residual water vapor in the third conduit into the factory exhaust pipe.

The method for preventing vapor contamination in an oxidation chamber may further include the step of flowing through the second conduit and the third conduit $N_2$ gas, or the step of flowing $H_2$ and $O_2$ into the torch generating the water vapor. The method may further include the step of conducting a wet oxidation process on a plurality of silicon substrates in the chamber, or the step of conducting a dry oxidation process on a plurality of silicon wafers in the chamber after residual water vapor is purged away in the chamber and in the third conduit by the inert gas. The method may further include the step of flowing only $O_2$ gas into the torch and the chamber for conducting the dry oxidation process.

In another preferred embodiment, an apparatus for conducting wet oxidation on silicon substrates may be provided which includes an oxidation chamber, a torch situated outside the oxidation chamber, a first conduit for flowing water vapor from a torch to an oxidation chamber, the first conduit may include a first valve for controlling a rate of gas flown therethrough, a second conduit for flowing an inert gas into the first conduit at a location between the first valve and the chamber, and a third conduit connecting the first conduit at a location between the torch and the first valve to a factory exhaust for flowing an inert gas therethrough and for purging away residual water vapor in the first conduit.

In the apparatus for conducting wet oxidation on silicon substrates, the oxidation chamber is further adapted for carrying out a dry oxidation process. The apparatus may further include conduits for flowing $H_2$ and $O_2$, respectively into the torch for generating water vapor. The second conduit may be adapted for feeding an inert gas into the oxidation chamber for annealing the silicon substrates. The first conduit may contain residual water vapor after a wet oxidation process is conducted in the oxidation chamber. The inert gas flown through the second conduit and the third conduit may be $N_2$.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for oxidizing silicon substrates. In the apparatus, an additional conduit is provided which is capable of exhausting residual water vapor left in the conduit that connects an external torch to an oxidation chamber such that the subsequent oxidation process, i.e., a dry oxidation process, may not be affected by the residual water vapor.

The present invention allows a wet oxidation apparatus for silicon substrates to be used for dry oxidation process such that the same apparatus can be more versatilely utilized. The present invention apparatus is therefore especially suitable for use in dry-wet-dry multiple oxidation processes in which three separate layers of silicon oxide are formed with satisfactory deposition rate.

The present invention novel apparatus and method is especially suitable for the deposition of thin gate oxide layers wherein thickness control is difficult to maintain and the smallest amount of residual water vapor may affect the quality of the film deposited. The present invention novel apparatus utilizes a new torch design that is equipped with an additional conduit for by-passing directly to a factory exhaust pipe for evacuating residual water vapor in the conduit connecting the torch to the oxidation chamber. The present invention novel apparatus further prevents unwanted water vapor from flowing into the oxidation chamber, or furnace. The present invention apparatus further allows pure nitrogen anneal of the silicon substrates at high temperature while preventing water vapor from entering the furnace during the annealing process. With the present invention novel method, thin gate oxide layers can be deposited with significantly improved quality than that possible with conventional equipment.

Figure 1:
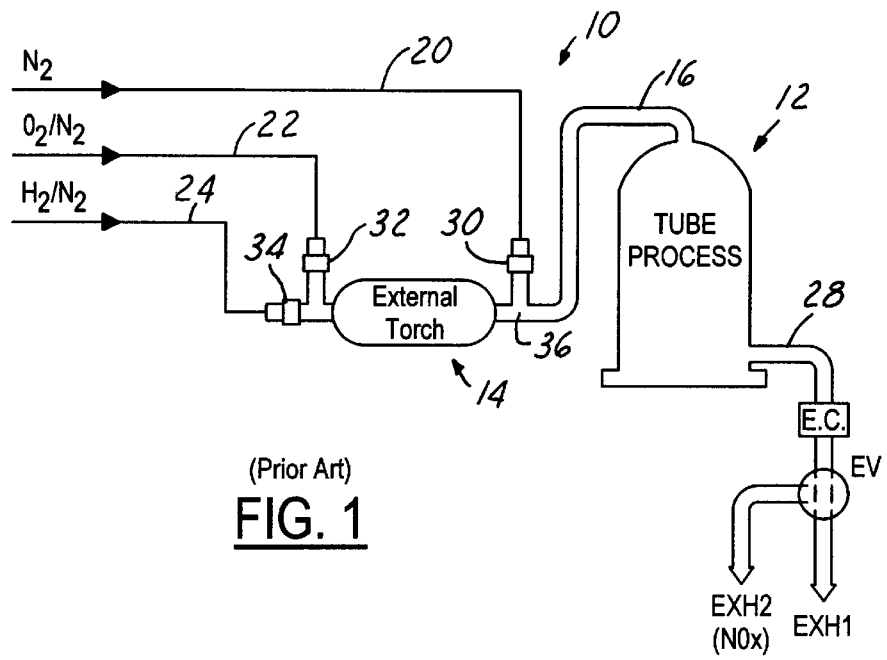
FIG. 1 is a schematic showing a conventional wet oxidation apparatus for silicon substrates.
Figure 2:
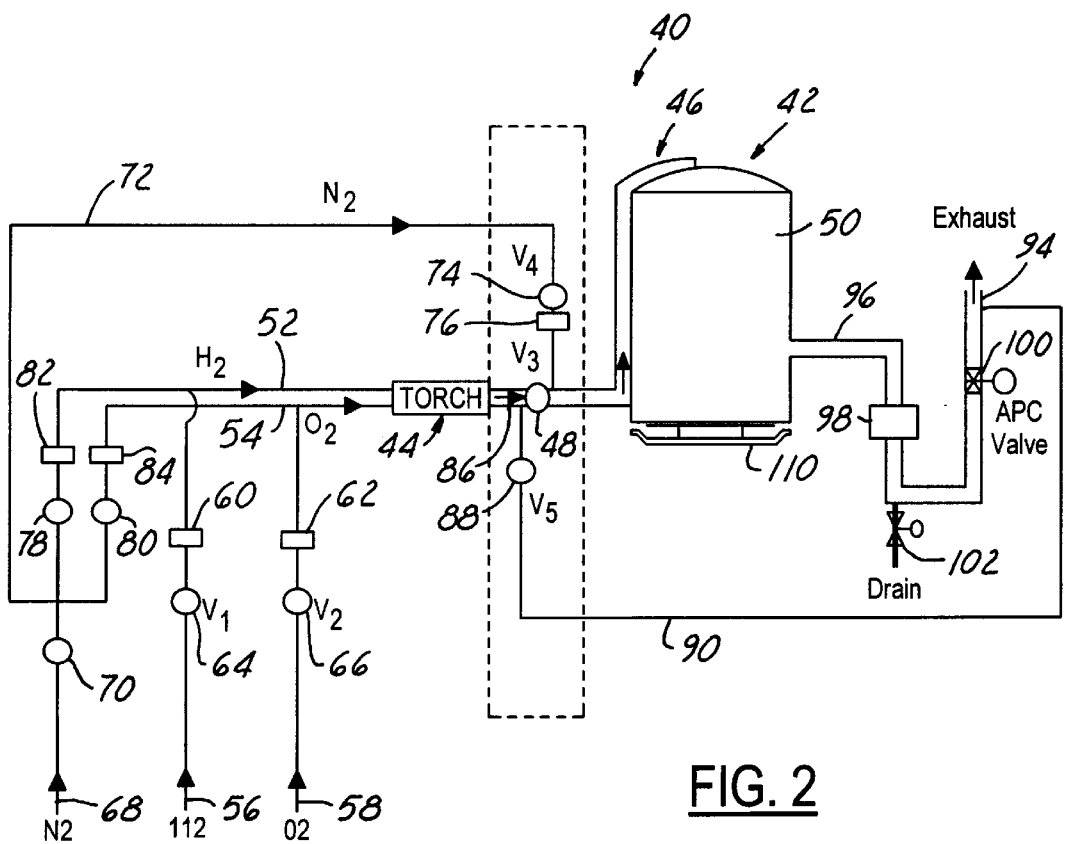
FIG. 2 is a schematic showing the present invention wet oxidation process for silicon substrates that can also be used for dry oxidation process.

Referring now to FIG. 2, wherein a present invention novel wet oxidation/dry oxidation apparatus 40 is shown. In the apparatus 40, an oxidation chamber 42 is first connected to an external torch 44 through conduit 46. Conduit 46 is further controlled by valve 48 for the opening or closing at the conduit. Valve 48 is further identified as $V_3$ in FIG. 2. The torch 44 is being fed by conduits 52, 54 respectively for $H_2$ and $O_2$ from a $H_2$ supply source 56 and an $O_2$ supply source 58. The conduits 52, 54 is further controlled by mass flow controllers (MFC) 60, 62 and valves 64, 66, respectively. A nitrogen supply source 68 is further connected in fluid communication with the conduit 52, 54 as an inert gas carrier for the $H_2$ and $O_2$ gas. Pure $N_2$ from the $N_2$ supply source 68 also flows through conduit 72 controlled by valve 74 ($V_4$) and mass flow controller 76 for feeding into conduit 46 at a point between the first valve 48 and the oxidation chamber 42. The conduit 72, with valve 48 closed, feeds a pure nitrogen flow into the oxidation chamber 42 and fills the chamber cavity 50 with pure $N_2$ for a nitrogen annealing process at high temperature. The flow of nitrogen from the supply source 68 is further controlled by valves 70, 78 and 80, and by mass flow controller 82, 84.

One of the important features of the present invention is the additional conduit 90, controlled by valve 88 (or $V_5$) and connected to conduit 46 at a point between the torch 44 and the first valve 48. The other end of the conduit 90 is directly connected to a factory exhaust pipe 94. The conduit 90 allows the evacuation of any residual water vapor trapped in section 86 of conduit 46 such that the oxidation chamber 42 can be used for a dry oxidation process following a wet oxidation process.

The oxidation chamber 42 is further equipped with an exhaust conduit 96 for the evacuation of unused or excess water vapor and any other possible by-products of the oxidation reaction. The conduit 96 is controlled by a mass flow controller 98 and valve 100. A drain valve 102 is further provided at a low point of conduit 96 for draining any water collected in the conduit. The oxidation chamber 42 is further equipped with an elevator device 110 which is not shown in detail for the raising or lowering of wafers in the chamber.

The present invention novel apparatus 40 can be operated in the following manner. At the beginning of a wet oxidation process, pure oxygen is first used to purge the conduit 46 and the cavity 50 in the oxidation chamber 42. The same purging process by pure oxygen may also be used to form silicon oxide on the silicon surface by a dry oxidation process under suitable high temperatures. During this first step of oxygen purging process, valve 48 and 74 are closed, while valve 88 is opened when purging conduit section 86, while valve 48 is opened and valves 84, 88 are closed when performing a dry oxidation process in the chamber cavity 50.

In the second step of the process, wherein wet oxidation is conducted, only valve 48 is open to allow water vapor generated in torch 44 to enter chamber cavity 50, while valves 74 and 88 are closed. After the wet oxidation is successfully completed, the third step may be either an oxygen dilution process by allowing oxygen to enter into the chamber cavity 50 after section 86 of the conduit is first purged by opening valve 88 with nitrogen gas, or the third step may be carried out by closing valve 48 and opening valves 74, 88 for purging conduit 72, 86 and 90 with pure $N_2$ and thus, carrying away any residual water vapor left in the conduit section 86 to the factory exhaust 94. The present invention novel apparatus therefore allows dry oxidation, as well as wet oxidation of silicon substrates to be conducted in the same oxidation chamber. It should be noted that valve 74 only controls nitrogen gas and thus is only opened when the silicon substrates are annealed with pure nitrogen gas.

The present invention novel apparatus and method for using the apparatus have therefore been amply described in the above descriptions and in the appended drawing of FIG. 2.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. An apparatus for oxidizing silicon substrates comprising:
    an oxidation chamber for conducting an oxidation reaction on silicon substrates contained therein,
    a first conduit for feeding $H_2$ into an external torch,
    a second conduit for feeding $O_2$ into said external torch,
    a third conduit for feeding $H_2O$ vapor generated in said external torch into said oxidation chamber, said third conduit further comprises a first valve mounted between said external torch and said oxidation chamber,
    a fourth conduit for feeding an inert gas into said third conduit at a location between said first valve and said oxidation chamber, said fourth conduit further comprises a second valve, and
    a fifth conduit controlled by a third valve having a first end in fluid communication with said third conduit upstream of said first valve and a second end in fluid communication with an exhaust from said oxidation chamber such that residual $H_2O$ vapor in said third conduit after a wet oxidation process is purged out.

2. An apparatus for oxidizing silicon substrates according to claim 1, wherein said apparatus is adapted for conducting a wet oxidation process or for conducting a dry oxidation process.

3. An apparatus for oxidizing silicon substrates according to claim 1, wherein said first conduit and said second conduit each comprises a valve and a mass flow controller.

4. An apparatus for oxidizing silicon substrates according to claim 1, wherein said fourth conduit is adapted for feeding an inert gas into said oxidation chamber for annealing said silicon substrates.

5. An apparatus for oxidizing silicon substrates according to claim 1, wherein a section of said third conduit between said external torch and said first valve contains residual water vapor after a wet oxidation process is conducted in said oxidation chamber.

6. An apparatus for oxidizing silicon substrates according to claim 1 further comprising a sixth conduit in fluid communication with a cavity in said oxidation chamber for exhausting into a factory exhaust.

7. An apparatus for oxidizing silicon substrates according to claim 1, wherein said fourth conduit feeds $N_2$ gas into said oxidation chamber for annealing said silicon substrates.

8. An apparatus for oxidizing silicon substrates according to claim 1, wherein said fifth conduit feeds an inert gas from said fourth conduit for carrying residual water vapor in said third conduit into said exhaust.

9. A method for preventing water vapor contamination in an oxidation chamber comprising the steps of:

providing an oxidation chamber equipped with a torch, a first conduit providing fluid communication between said chamber and said torch controlled by a first valve situated in said first conduit, a second conduit for feeding an inert gas into said first conduit at a location between said first valve and said chamber, and a third conduit connected to said first conduit for exhausting residual water vapor in said first conduit into a factory exhaust pipe, flowing water vapor from said torch into said chamber through said first conduit for conducting a wet oxidation process in said chamber, closing said first valve, flowing an inert gas through said second conduit into said chamber for purging said chamber, and flowing an inert gas through said torch and said third conduit for purging residual water vapor in said third conduit into said factory exhaust pipe.

10. A method for preventing water vapor contamination in an oxidation chamber according to claim 9 further comprising the step of flowing through said second conduit and said third conduit $N_2$ gas.

11. A method for preventing water vapor contamination in an oxidation chamber according to claim 9 further comprising the step of flowing $H_2$ and $O_2$ into said torch generating said water vapor.

12. A method for preventing water vapor contamination in an oxidation chamber according to claim 9 further comprising the step of conducting a wet oxidation process on a plurality of silicon substrates in said chamber.

13. A method for preventing water vapor contamination in an oxidation chamber according to claim 9 further comprising the step of conducting a dry oxidation process on a plurality of silicon wafers in said chamber after residual water vapor is purged away in said chamber and in said third conduit by said inert gas.

14. A method for preventing water vapor contamination in an oxidation chamber according to claim 13 further comprising the step of flowing only $O_2$ gas into said torch and said chamber for conducting said dry oxidation process.

15. An apparatus for conducting wet oxidation on silicon substrates comprising:

an oxidation chamber, a torch situated outside said oxidation chamber, a first conduit for flowing water vapor from said torch to an oxidation chamber, said first conduit comprises a first valve for controlling a rate of gas flown therethrough, a second conduit for flowing an inert gas into said first conduit at a location between said first valve and said chamber, and a third conduit connecting said first conduit at a location between said torch and said first valve to a factory exhaust for flowing an inert gas therethrough and for purging away residual water vapor in said first conduit.

16. An apparatus for conducting wet oxidation on silicon substrates according to claim 15, wherein said oxidation chamber is further adapted for carrying out a dry oxidation process.

17. An apparatus for conducting wet oxidation on silicon substrates according to claim 15 further comprising conduits for flowing $H_2$ and $O_2$, respectively into said torch for generating water vapor.

18. An apparatus for conducting wet oxidation on silicon substrates according to claim 15, wherein said second conduit being adapted for feeding an inert gas into said oxidation chamber for annealing said silicon substrates.

19. An apparatus for conducting wet oxidation on silicon substrates according to claim 15, wherein said first conduit contains residual water vapor after a wet oxidation process is conducted in said oxidation chamber.

20. An apparatus for conducting wet oxidation on silicon substrates according to claim 15, wherein said inert gas flown through said second and third conduits is $N_2$.

* * * * *